US010672574B2

(12) United States Patent
Kim

(10) Patent No.: US 10,672,574 B2
(45) Date of Patent: Jun. 2, 2020

(54) DC BREAKER CAPABLE OF BLOCKING FAULT CURRENT GENERATED IN DIRECT CURRENT LINES

(71) Applicant: HYOSUNG HEAVY INDUSTRIES CORPORATION, Seoul (KR)

(72) Inventor: Byung Choul Kim, Incheon (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 239 days.

(21) Appl. No.: 15/738,806

(22) PCT Filed: Jun. 22, 2016

(86) PCT No.: PCT/KR2016/006632
§ 371 (c)(1),
(2) Date: Dec. 21, 2017

(87) PCT Pub. No.: WO2016/208968
PCT Pub. Date: Dec. 29, 2016

(65) Prior Publication Data
US 2018/0174784 A1    Jun. 21, 2018

(30) Foreign Application Priority Data

Jun. 22, 2015    (KR) ........................ 10-2015-0088177

(51) Int. Cl.
*H01H 33/59*    (2006.01)
*H01H 9/54*    (2006.01)
(Continued)

(52) U.S. Cl.
CPC .......... *H01H 33/596* (2013.01); *H01H 9/542* (2013.01); *H02H 3/087* (2013.01); *H01H 9/547* (2013.01); *H03K 17/0814* (2013.01)

(58) Field of Classification Search
CPC ....... H01H 2009/543; H01H 2009/544; H01H 33/143; H01H 33/18; H01H 33/56;
(Continued)

(56) References Cited

U.S. PATENT DOCUMENTS 4,805,062 A * 2/1989 Shirouzu .............. H01H 33/596
361/13
4,920,448 A * 4/1990 Bonhomme ........... H01H 3/222
361/102
(Continued)

FOREIGN PATENT DOCUMENTS

DE           3734989 A1 *   4/1988   .......... H01H 33/596
JP      2000090787 A        3/2000
(Continued)

*Primary Examiner* — Thienvu V Tran
*Assistant Examiner* — Nicolas Bellido
(74) *Attorney, Agent, or Firm* — Novick, Kim & Lee, PLLC; Jae Youn Kim

(57) ABSTRACT

Provided is a DC breaker that can block a fault current generated in a direct current line, by using a unidirectional semiconductor switch device. The DC breaker includes: a mechanical switch that is connected between first and second direct current lines; a first unidirectional semiconductor switch device that transfers a resonant current to the first direct current line when the fault current is generated, so that a current of the first direct current line becomes zero; an LC resonant circuit that is charged by receiving a steady state current of the first direct current line, and generates the resonant current to the first unidirectional semiconductor switch device when the fault current is generated; and a second unidirectional semiconductor switch device that enables a capacitor of the LC resonant circuit to be charged with the steady state current of the first direct current line.

8 Claims, 4 Drawing Sheets

(51) Int. Cl.
*H02H 3/087* (2006.01)
*H03K 17/0814* (2006.01)

(58) Field of Classification Search
CPC ...... H01H 33/596; H01H 33/703; H01H 9/30;
H01H 9/446; H01H 9/542; H01H 9/547;
H02H 3/021; H02H 3/087; H02H 3/16
See application file for complete search history.

(56) References Cited

U.S. PATENT DOCUMENTS

| | | | |
|---|---|---|---|
| 9,413,157 B2 * | 8/2016 | Tahata | H02H 3/087 |
| 10,418,210 B2 * | 9/2019 | Kim | H01H 33/596 |
| 2003/0193770 A1 * | 10/2003 | Chung | H01H 9/542 |
| | | | 361/118 |
| 2016/0204595 A1 * | 7/2016 | Park | H02H 3/087 |
| | | | 361/10 |
| 2016/0322177 A1 * | 11/2016 | Hwang | H02H 3/087 |
| 2016/0322178 A1 * | 11/2016 | Park | H01H 9/30 |
| 2016/0329179 A1 * | 11/2016 | Kim | H01H 33/596 |

FOREIGN PATENT DOCUMENTS

| | | | | |
|---|---|---|---|---|
| JP | 2002093294 A | | 3/2002 | |
| KR | 20000060552 A | * | 10/2000 | ........... H01H 33/596 |
| KR | 101183508 A | | 3/2011 | |
| KR | 1020140095184 A | | 8/2014 | |
| KR | 1020150019416 A | | 2/2015 | |
| KR | 101522411 B1 | | 5/2015 | |
| KR | 101845826 B1 | * | 4/2018 | |
| WO | 2015102385 A1 | | 7/2015 | |

* cited by examiner

DC BREAKER CAPABLE OF BLOCKING FAULT CURRENT GENERATED IN DIRECT CURRENT LINES

TECHNICAL FIELD

The present disclosure relates to a DC breaker and, more particularly, to a DC breaker that can block a fault current generated in a direct current line by using a unidirectional semiconductor switch device.

BACKGROUND ART

A DC breaker (direct current circuit breaker) is used to block a fault current when a fault occurs in a direct current line used as a high voltage transmission line. The direct current line used for a high voltage is used as a transmission line of a high voltage equal to or greater than 50 kV of a high voltage direct current (HVDC) transmission system or a distribution line of a middle voltage equal to or less than 50 kV of a middle voltage direct current distribution system.

The DC breaker is equipped with a mechanical switch to block a fault current when a fault occurs in the direct current line. The mechanical switch blocks the fault current by opening to prevent a system in which a fault occurs from affecting another system in normal state when a fault current is generated in a HVDC transmission system or a middle voltage direct current distribution system. The mechanical switch may have an arc generated when it is opened to block the fault current. Once the arc is generated, the fault current flows continuously via the arc, thereby damaging various elements of a system.

A related art to resolve problems described as above is disclosed in Korean Patent No. KR 1183508. The Korean Patent No. KR 1183508 relates to a current blocking device and is configured to include at least one interrupter, a surge arrester, and a resonant circuit.

Each of the one or more interrupters is used as a mechanical switch and has a plurality of contacts which are movable from a closing position to an opening position relative to each other to block a current entering through the interrupter which is disposed in a first current path. The surge arrester is connected to the resonant circuit in parallel, starts to send a current when a voltage being applied to the interrupter during the separation of the contacts reaches a predetermined value, and allows a direct current to flow as a result of existence of a voltage applied to the interrupter of the first current path until the direct current changes a direction to a second current path connected to the first current path. The resonant circuit is connected to the interrupter in parallel, is configured to include a capacitor and an inductor which are connected in series, and generates an oscillating current overlapping with the direct current to be able to block the current entering through the interrupter by allowing the current entering through the interrupter to become zero when the contacts are separated.

A conventional DC breaker such as the Korean Patent No. KR 1183508 has a problem that determination of charging direction of a charging voltage being charged into the capacitor of the resonant circuit is limited and a control time cannot be also determined in the case of supplying the oscillating current to the interrupter.

DISCLOSURE

Technical Problem

Accordingly, the present disclosure has been made keeping in mind the above problems occurring in the prior art, and an objective of the present disclosure is to resolve problems described above, thereby to provide a DC breaker that can block a fault current generated in a direct current line by using a unidirectional semiconductor switch device.

Another object of the present disclosure is to provide a DC breaker that can improve operating reliability of a product by simplifying the structure of the DC breaker which uses a unidirectional semiconductor switch that can block a fault current of a mechanical switch.

Technical Solution

A breaker according to an embodiment according to the present disclosure includes:

A mechanical switch having one end connected to a first direct current line and an opposite end connected to a second direct current line; a first unidirectional semiconductor switch device, being connected to the second direct current line to be in parallel with the mechanical switch, and allowing a current of the first direct current line to become zero by transferring a current via the connected second direct current line to the first direct current line where a steady state current enters into when a fault current is generated; an LC resonant circuit, being connected in series between the first unidirectional semiconductor switch device and a ground (GND), and being charged by receiving the steady state current transferred from the first direct current line, and generating and supplying a resonant current to the first unidirectional semiconductor switch device when the fault current is generated; and a second unidirectional semiconductor switch device, being connected in parallel with each of the first unidirectional semiconductor switch device and the LC resonant circuit, and allowing the capacitor provided in the LC resonant circuit to be charged by supplying the steady state current transferred from the first direct current line to the LC resonant circuit.

The first unidirectional semiconductor switch device in the present disclosure includes a single first thyristor, wherein the first thyristor enables the current entering into the first direct current line to become zero by supplying the resonant current to the mechanical switch connected to the first direct current line where the steady state current enters into when the fault current is generated.

The first thyristor in the present disclosure includes an anode terminal, a cathode terminal, and a gate terminal, wherein the anode terminal is connected to the LC resonant circuit, the cathode terminal is connected to the second direct current line, and the gate terminal, by receiving a trigger pulse when the fault current is generated, transfers the resonant current supplied from the LC resonant circuit to the first direct current line where the steady state current enters into.

The second unidirectional semiconductor switch device in the present disclosure includes a single second thyristor and supplies the steady state current from the first direct current line to the LC resonant circuit by being arranged in reverse direction of the first unidirectional semiconductor switch device and by being connected between the first direct current line and an intermediate point N between the first thyristor and the LC resonant circuit.

The second thyristor in the present disclosure includes an anode terminal, a cathode terminal, and a gate terminal, wherein the anode terminal is connected to the first direct current line, the cathode terminal is connected to an intermediate point (N) between the LC resonant circuit and an anode terminal of the first thyristor, and the gate terminal, being activated when a trigger pulse is received, allows the steady state current from the first direct current line to be entered into the LC resonant circuit via the second thyristor.

The LC resonant circuit in the present disclosure includes a capacitor being connected to the first unidirectional semiconductor switch device in series and being charged by receiving the steady state current supplied from the first direct current line, and an inductor being connected to the capacitor in series and generating and supplying the resonant current when the first unidirectional semiconductor switch device is activated.

The resonant current supplied from the LC resonant circuit in the present disclosure is greater than the steady state current entering into the first direct current line.

The mechanical switch in the present disclosure, on the one end or the opposite end thereof, is connected to a current flow control circuit, wherein the current flow control circuit includes an inductor being connected to the one end or the opposite end of the mechanical switch and limiting the rate of rise of the fault current, and a diode being connected in parallel with the inductor and limiting the current limit function of the inductor.

Advantageous Effects

As described above, the present disclosure has advantages that the DC breaker can block the fault current generated in the direct current line by using the unidirectional semiconductor switch and can improve operating reliability of a product by simplifying the structure of the DC breaker and by blocking the fault current by using only a single unidirectional semiconductor switch, thereby saving the manufacturing cost. Unless the fault current is removed during the operation of the DC breaker, it is allowed to perform blocking operation again.

MODE FOR INVENTION

Hereinafter, an exemplary embodiment according to the present disclosure will be described in detail below with reference to the accompanying drawings. Repeated descriptions and descriptions of known functions and configurations which have been deemed to make the gist of the present invention unnecessarily obscure will be omitted below.

Figure 1:
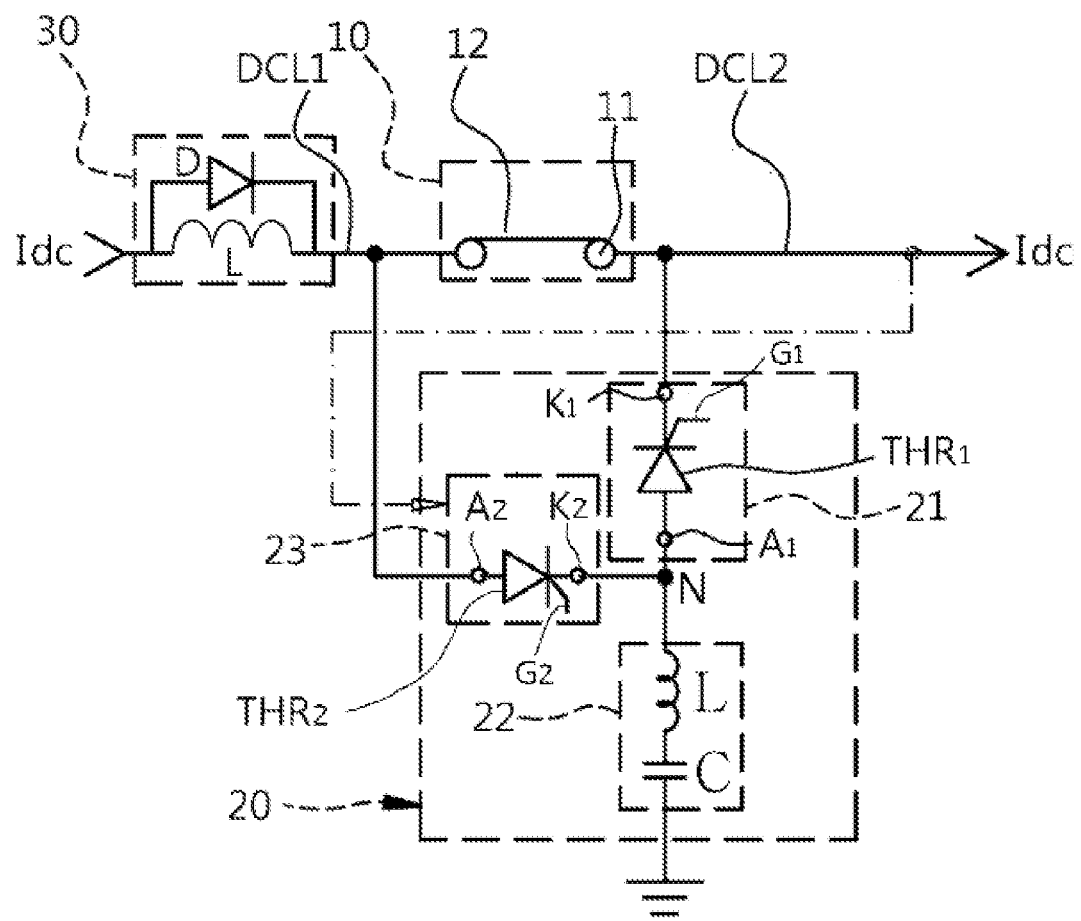
FIG. 1 is a view of the circuit illustrating a DC breaker according to the present disclosure.

FIG. 1 is a view of the circuit illustrating a DC breaker according to an embodiment according to the present disclosure.

As illustrated in FIG. 1, the DC breaker according to an embodiment according to the present disclosure includes a mechanical switch 10, a unidirectional power control switching circuit 20, and a current flow control circuit 30.

For the mechanical switch 10, one end thereof is connected to a first direct current line DCL1 and an opposite end thereof is connected to a second direct current line DCL2. A unidirectional power control switching circuit 20 is connected between the second direct current line DCL2 and a ground to be in parallel with the mechanical switch 10 and enables a current to become zero Iz by supplying resonant current Ilc to the mechanical switch 10 where a steady state current Idc enters into when a fault current Ifault at the mechanical switch 10 is generated. That is, the unidirectional power control switching circuit 20, when the fault current Ifault is generated, allowing the current of the first direct current line DCL1 to become zero Iz by supplying the resonant current Ilc via second direct current line DCL2 to the first direct current line DCL1 where the steady state current Idc enters, prevents an arc from occurring or facilitates arc-suppressing for the arc generated during an opening operation of the mechanical switch 10 where the steady state current Idc enters.

The DC breaker, having configuration as above, according to the present disclosure is described in more detail as follows.

The mechanical switch 10 includes a contact point terminal 11 and a switching contact point terminal 12 as illustrated in FIG. 1. The contact point terminal 11 to be located on one end of the mechanical switch 10 is connected to the first direct current line DCL1 and allows the steady state current Idc to flow into the switching contact point terminal 12 in a state that the mechanical switch 10 is closed when the steady state current Idc is supplied through the first direct current line DCL1. The switching contact point terminal 12 to be located on an opposite end of the mechanical switch 10 is connected to the second direct current line DCL2 and transfers the steady state current Idc being supplied from the first direct current line DCL1 to the second direct current line DCL2. The mechanical switch 10 blocks the fault current Ifault entering the second direct current line DCL2 by disconnecting a connected state between the contact point terminal 11 and the switching contact point terminal 12 when the fault current Ifault is generated in the second direct current line DCL2 and the current entering into the first direct current line DCL1 becomes the zero Iz.

A unidirectional power control switching circuit 20 is configured to include a first unidirectional semiconductor switch device 21, an LC resonant circuit 22, and a second unidirectional semiconductor switch device 23, as illustrated in FIG. 1.

The first unidirectional semiconductor switch device 21 is connected to the second direct current line DCL2 to be in parallel with the mechanical switch 10 and allows the entering current to become zero Iz by transferring the resonant current Ilc to the first direct current line DCL1 in the case where the steady state current Idc enters into the first direct current line when the fault current Ifault is generated. In an embodiment according to the present disclosure, the first unidirectional semiconductor switch device 21 like this is a semiconductor device capable of performing on/off control to transfer the resonant current Ilc to the first direct current line DCL1 where the steady state current Idc enters into when the fault current Ifault is generated, and, for example, the first thyristor can be used for this.

The first thyristor THR1 enables the current entering into the first direct current line DCL1 to become zero Iz by transferring the resonant current Ilc to the mechanical switch 10 which is connected to the first direct current line DCL1 where the steady state current Idc enters when the fault current Ifault is generated, and is configured with a cathode terminal K1, an anode terminal A1, and a gate terminal G1.

The anode terminal A1 of the first thyristor THR1 is connected to the LC resonant circuit 22 and cathode terminal K1 is connected to the second direct current line DCL2. The gate terminal G1 is connected to a controller (not shown) and is activated when a trigger pulse is received from the controller due to generation of the fault current Ifault. Then, the gate terminal G1 makes the current to become zero Iz by transferring the resonant current Ilc generated from the LC resonant circuit 22 to the first direct current line DCL1, the transfer occurring at the location where the steady state current Idc enters into the first direct current line.

The LC resonant circuit 22 is configured with a capacitor C and an inductor L and is connected in parallel to the first unidirectional semiconductor switch device 21 and the second unidirectional semiconductor switch device 22 between an intermediate point (N) and a ground (GND). The LC resonant circuit 22 is charged with the steady state current Idc being received from the first direct current line DCL1 and generates and supplies the resonant current Ilc, i.e., LC resonant current by using charged current when the first unidirectional semiconductor switch device 21 is triggered. Though an embodiment is illustrated in FIG. 1 in such a way that the capacitor C is charged by receiving the steady state current Idc entering from the first direct current line DCL1, in another embodiment, the capacitor C can be also charged from the right side to the left of FIG. 1, that is, in the case that the steady state current flows from the second direct current line DCL2 to the first direct current line DCL1. However, the present disclosure will be described for the sake of convenience, and the capacitor C is charged with the steady state current Idc entering from the first direct current line DCL1 as illustrated in FIG. 1.

Figure 4:
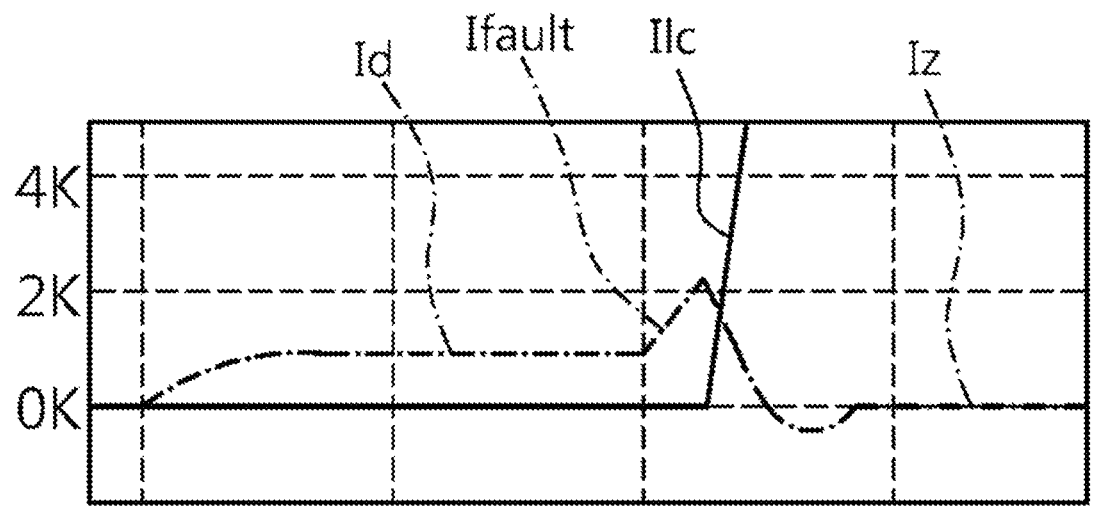
FIG. 4 is a view of current waves illustrating the operation state of the DC breaker according to the present disclosure.

The capacitor C is charged with the steady state current Idc being supplied via the first direct current line DCL1 and the inductor L, connected to the capacitor C, generates and supplies the resonant current Ilc when the first unidirectional semiconductor switch device 21 is activated. The resonant current Ilc supplied from the LC resonant circuit 22 having configuration like this is greater than the steady state current Idc entering into the first direct current line DCL1. That is, the resonant current Ilc is a current supplied from the LC resonant circuit 22 when resonance occurs by capacitive reactance and inductive reactance coinciding with each other, and becomes a maximum current as illustrated in FIG. 4.

The LC resonant circuit 22 is connected to a ground GND, thereby allowing the steady state current Idc entering into the first direct current line DCL1 to be supplied to the LC resonant circuit 22.

The second unidirectional semiconductor switch device 23 is connected in series with the first unidirectional semiconductor switch device 21 and, and in parallel to the LC resonant circuit 22 and allows the capacitor C provided in the LC resonant circuit 22 to be charged by supplying the steady state current Idc to the LC resonant circuit 22. The second unidirectional semiconductor switch device 23 like this is arranged in reverse direction of the first unidirectional semiconductor switch device 21 and is connected to both of the one end of mechanical switch 10 and the first direct current line DCL1, as in FIG. 1, thereby switching the flow of the current. To do this, a second unidirectional semiconductor switch device 23 is a semiconductor device capable of performing on/off control and, for example, the second thyristor THR2 can be used for this. Accordingly, the second thyristor is connected between the first direct current line DCL1 and the anode A1 of the first thyristor THR1 to supply the steady state current Idc from the first direct current line DCL1 to the LC resonant circuit 22. That is, the second thyristor THR2 is connected between the first direct current line DCL1 and an intermediate point N between the first thyristor THR1 and the LC resonant circuit 22, and equipped with a cathode terminal K2, an anode terminal A2, and a gate terminal G2.

The anode terminal A2 of the second thyristor THR2 is connected to the first direct current line DCL1 and the cathode terminal K2 is connected to the intermediate point N between the anode terminal A1 of the first thyristor THR1 and the LC resonant circuit 22. The gate terminal G2 is connected to the controller described above and is activated in response to a trigger pulse output from the controller, thus allowing the steady state current Idc from the first direct current line DCL1 to enter into the LC resonant circuit 22 via the second thyristor THR2.

The current flow control circuit 30 being connected to the one end or the opposite end of the mechanical switch 10 controls the current flow and is composed of the inductor L and the diode D. The inductor L is connected to the one end or the opposite end of the mechanical switch 10 and limits the rate of rise of the fault current Ifault di/dt and the diode D is connected in parallel with the inductor L and limits the limitation function of the current of the inductor L.

Figure 2:
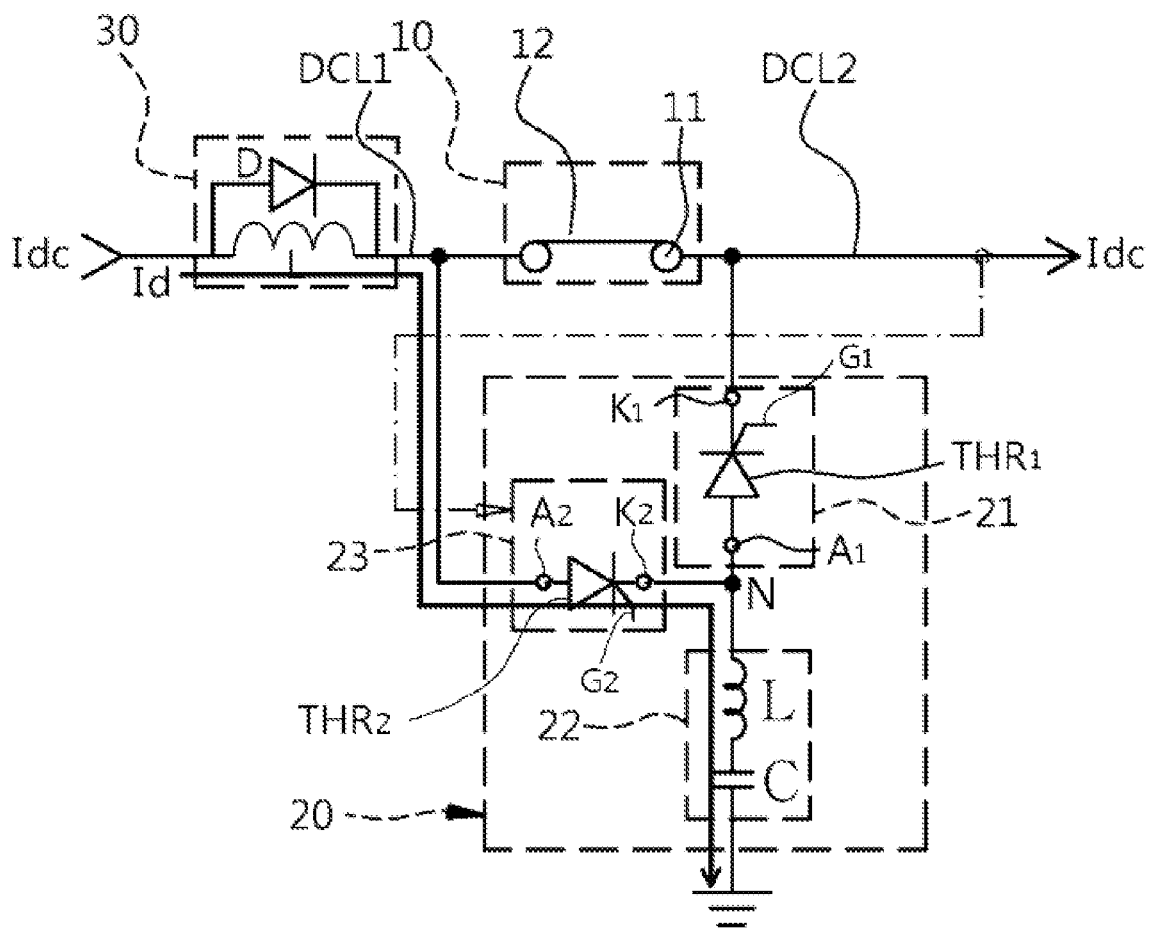
FIG. 2 is a view of the circuit illustrating an operation state of the DC breaker in a normal state according to an embodiment according to the present disclosure.
Figure 3:
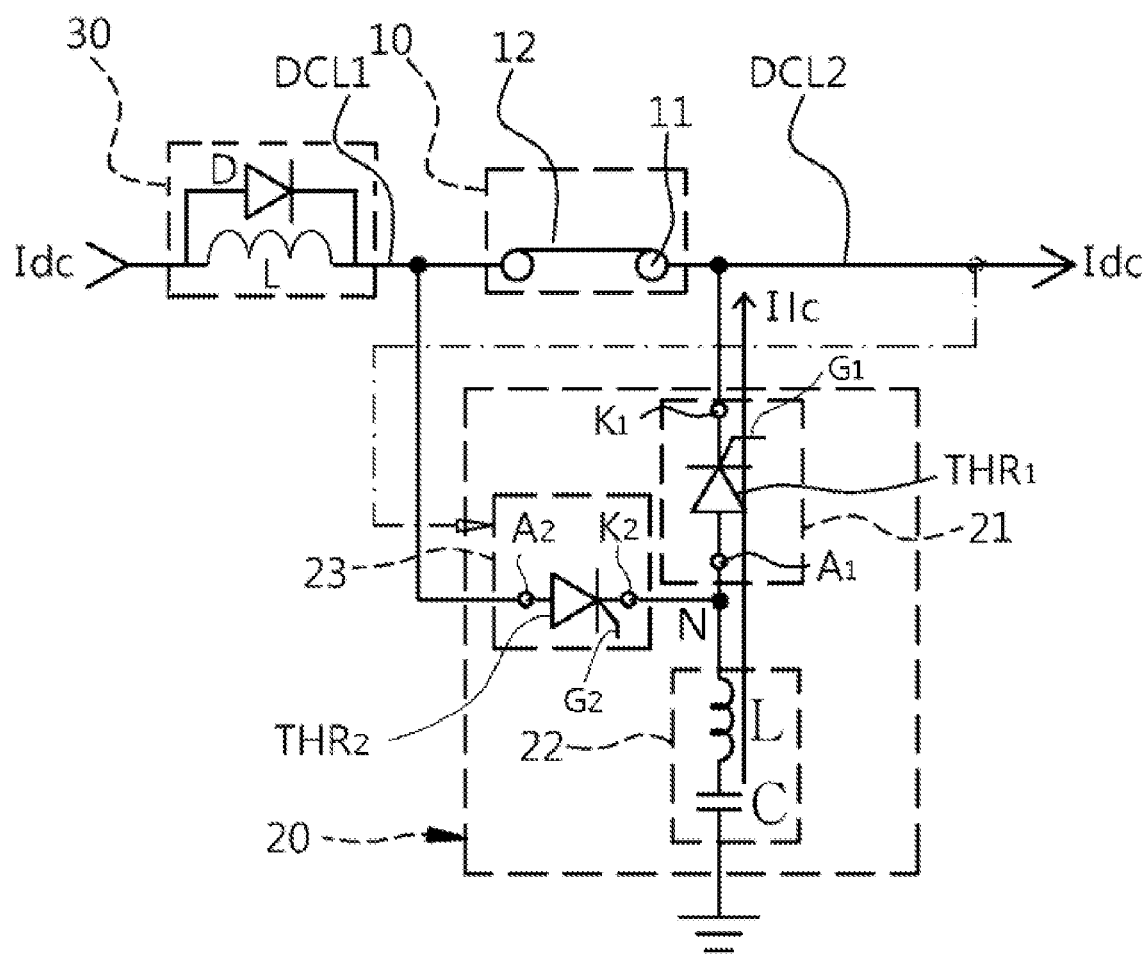
FIG. 3 is a view of the circuit illustrating an operation state of the DC breaker when a fault current is generated, according to an embodiment according to the present disclosure.

Operation of the DC breaker having a configuration according to an embodiment according to the present disclosure will be described in reference with accompanying FIGS. 2 and 3 below.

The DC breaker illustrated in FIG. 1 illustrates a state that the steady state current Idc is supplied from the first direct current line DCL1 to the second direct current line DCL2. When the steady state current Idc is supplied without generation of the fault current Ifault in the first direct current line DCL1 or the second direct current line DCL2, the contact point terminal 11 and the switching contact point terminal 12 provided in the mechanical switch 10 enter into a state of being connected.

When the contact point terminal 11 and the switching contact point terminal 12 are connected, the steady state current Idc is supplied from the first direct current line DCL1 to the second direct current line DCL2 via the mechanical switch 10. At this point, the first direct current line DCL1 and the second direct current line DCL2 may use the same lines. When the steady state current Idc is supplied to the first direct current line DCL1, the steady state current Idc flows into the LC resonant circuit 22 by the second unidirectional semiconductor switch device being in an On state and allows the capacitor C of the LC resonant circuit 22 to be charged.

When the fault current Ifault is generated in the second direct current line DCL2 in a state the capacitor C is charged, the first thyristor THR1 used as the first unidirectional semiconductor switch device 21 is turned on by activating by the trigger signal output from the controller. Once the first thyristor THR1 is activated and turned on, the resonant current Ilc is generated in the LC resonant circuit 22 by the voltage charged in the capacitor C, and the generated resonant current Ilc enters into the first direct current line DCL1, thereby enabling the current entering into the first direct current line DCL1 to become zero Iz. The resonant current Ilc like this is transferred to the first direct current line DCL1 through the second direct current line DCL2 connected to the opposite end of the mechanical switch 10 and the mechanical switch 10.

When the current entering into the first direct current line DCL1 becomes zero Iz, the fault current Ifault is prevented from entering into the first direct current line DCL1 by opening the mechanical switch 10 connected to the first direct current line DCL1. By accomplishing the current entering into the first direct current line DCL1 to become zero Iz, the fault current Ifault can be prevented from entering into the first direct current line DCL1 without generating an arc through disconnecting the connected state of the contact point terminal 11 and the switching contact point terminal 12. That is, as in FIG. 4, when the fault current Ifault is generated in the second direct current line DCL2, by generating and supplying the resonant current Ilc into the first direct current line DCL1, the supply occurring at the location where the steady state current Idc enters into the first direct current line DCL1, the current entering into the first direct current line DCL1 is forced to become zero Iz. In a view of FIG. 4, a vertical axis represents an amount of current ampere and horizontal axis a time.

After the fault current Ifault is blocked, when the steady state current Idc enters into the second direct current line DCL2 where the fault current Ifault was generated, as alternating long and two short dashes line illustrated in FIG. 1, the steady state current Idc charges the capacitor C of the LC resonant circuit 21 and generates the resonant current Ilc when the next fault current Ifault is generated. Through repetitive operation like this, the first direct current line DCL1 can be managed safely and reliably.

As described above, the DC breaker according to the present disclosure can block the fault current generated in the direct current line by using the unidirectional semiconductor switch and can improve operating reliability of the product by simplifying the structure of the DC breaker and by blocking the fault current by using only a single unidirectional semiconductor switch, thereby saving the manufacturing cost.

Although the present disclosure has been described in detail through exemplary embodiments, this is not intended to limit embodiments according to a concept of the present disclosure to a specific disclosure form. Those skilled in the art will appreciate that various modifications, additions and substitutions are possible, without departing from the scope and spirit of the invention as disclosed in the accompanying claims. Accordingly, the embodiments should be understood to include all modifications, equivalents or substitutes that are included in a concept and technical scope of the present disclosure.

The invention claimed is:

1. A DC breaker, comprising:
   a mechanical switch having one end connected to a first direct current line and an opposite end connected to a second direct current line;
   a first unidirectional semiconductor switch device, being connected to the second direct current line to be in parallel with the mechanical switch, and allowing a steady state current of the first direct current line to become zero by transferring a current via the connected second direct current line to the first direct current line in the case where the steady state current enters into the first direct current line when a fault current is generated;
   an LC resonant circuit, being connected in parallel with the first unidirectional semiconductor switch device between an intermediate point (N) and a ground (GND), and being charged by receiving the steady state current transferred from the first direct current line, and generating and supplying a resonant current to the first unidirectional semiconductor switch device when the fault current is generated; and
   a second unidirectional semiconductor switch device, being connected in series with the first unidirectional semiconductor switch device, and allowing a capacitor provided in the LC resonant circuit to be charged by supplying the steady state current transferred from the first direct current line to the LC resonant circuit.

2. The DC breaker of claim 1, wherein the first unidirectional semiconductor switch device includes a single first thyristor, wherein the first thyristor enables the steady current entering into the first direct current line to become zero by supplying the resonant current to the mechanical switch connected to the first direct current line where the steady state current enters into when the fault current is generated.

3. The DC breaker of claim 2, wherein the first thyristor includes:
   an anode terminal;
   a cathode terminal; and
   a gate terminal,
   wherein the anode terminal is connected to the LC resonant circuit,
   the cathode terminal is connected to the second direct current line, and
   the gate terminal, by receiving a trigger pulse when the fault current is generated, transfers the resonant current supplied from the LC resonant circuit to the first direct current line, the transfer occurring at the location where the steady state current enters into the first direct current line.

4. The DC breaker of claim 1, wherein the second unidirectional semiconductor switch device includes a single second thyristor and supplies the steady state current from the first direct current line to the LC resonant circuit by being arranged in a reverse direction of the first unidirectional semiconductor switch device.

5. The DC breaker of claim 4, wherein the second thyristor includes:
   an anode terminal;
   a cathode terminal; and
   a gate terminal,
   wherein the anode terminal is connected to the first direct current line,
   the cathode terminal is connected to the intermediate point (N) between the LC resonant circuit and an anode terminal of the first thyristor, and
   the gate terminal, being activated when a trigger pulse is received, allows the steady state current from the first direct current line to enter into the LC resonant circuit via the second thyristor.

6. The DC breaker of claim 1, wherein the LC resonant circuit includes:
   a capacitor being connected to the first unidirectional semiconductor switch device and being charged by receiving the steady state current supplied from the first direct current line; and
   an inductor being connected to the capacitor in series and generating and supplying the resonant current when the first unidirectional semiconductor switch device is activated.

7. The DC breaker of claim 6, wherein the LC resonant current supplied from the LC resonant circuit is greater than the steady state current entering into the first direct current line.

8. The DC breaker of claim 1, wherein the mechanical switch, on the one end or the opposite end thereof, is connected to a current flow control circuit, wherein the current flow control circuit includes:
an inductor being connected to the one end or the opposite end of the mechanical switch and limiting a rate of rise of the fault current; and
a diode being connected in parallel with the inductor and limiting a current limit function of the inductor.

* * * * *